United States Patent [19]
Pyndiah et al.

[11] Patent Number: 5,087,898
[45] Date of Patent: Feb. 11, 1992

[54] INTEGRATED SEMICONDUCTOR ACTIVE ISOLATOR CIRCUIT

[75] Inventors: Ramesh Pyndiah, Valenton, France; Francis van den Bogaart, Leidschendam, Netherlands

[73] Assignee: U.S. Philips Corp., New York, N.Y.

[21] Appl. No.: 663,074

[22] Filed: Feb. 28, 1991

Related U.S. Application Data

[63] Continuation of Ser. No. 490,119, Mar. 7, 1990, abandoned.

[30] Foreign Application Priority Data

Mar. 14, 1989 [FR] France ................ 89 03308

[51] Int. Cl.$^5$ ........................ H03H 11/38
[52] U.S. Cl. ................ 333/24 R; 307/571; 333/24.2
[58] Field of Search ............. 333/24 R, 24.2; 330/277, 293; 307/571

[56] References Cited

U.S. PATENT DOCUMENTS

| | | | |
|---|---|---|---|
| 3,300,738 | 1/1967 | Schlicke | 333/24.2 X |
| 3,501,716 | 3/1970 | Ferch et al. | 333/24 R X |
| 4,591,802 | 5/1986 | Asazawa | 330/293 X |
| 4,679,010 | 7/1987 | Bahl | 333/1.1 X |
| 4,801,901 | 1/1989 | Ayasli | 333/1 |

*Primary Examiner*—Paul Gensler
*Attorney, Agent, or Firm*—Steven R. Biren

[57] ABSTRACT

An integrated semiconductor active isolator circuit which includes a negative feedback amplifier having an active semiconductor amplifier element. The control terminal of the semiconductor amplifying element defines the output of the isolator circuit and a principal conduction electrode of the semiconductor amplifying element defines an input of the isolator circuit.

18 Claims, 5 Drawing Sheets

INTEGRATED SEMICONDUCTOR ACTIVE ISOLATOR CIRCUIT

This is a continuation of application Ser. No. 490,119, filed Mar. 7, 1990, abandoned.

BACKGROUND OF THE INVENTION

The invention relates to an integrated semiconductor arrangement comprising an active isolator circuit that includes at least one field effect transistor.

The invention finds its application in the realization of microwave frequency systems such as an antenna front end for satellites in which it is necessary to isolate the local oscillator from impedance variations of the mixer. The invention also finds its application in the realization of microwave circulators.

An isolator circuit is known from both U.S. Pat. No. 4,679,010, July 1987, and the publication entitled: "The design of a 6-Port active circulator" by I. J. BAHL in 1988 IEEE, MTT-S Digest, pp. 1011-1014. These documents describe an active circulator circuit constituted by three isolator circuits and three couplers.

More particularly the publication points out that in many microwave circuits non-reciprocal components such as isolators or circulators are useful for avoiding interaction between the various blocks of the system. In the conventional microwave systems a ferrite material was used to realize such components. At present, these components can be realized on GaAs substrates by adding ferrite disks and permanent magnets. However, this technique results in a very large size and considerable weight of the components and is not compatible with monolithic microwave integrated circuit technology. Therefore, the above-mentioned Patent and publication propose a completely integrable active circulator. For this purpose, in the aforementioned publication the isolator circuits necessary for realizing the circulator are constituted by monolithic distributed amplifiers having four cells operating between 1 to 10 GHz with a gain of 7 dB, return losses and isolation exceeding 12 dB and 20 dB respectively. Such an amplifier uses 4 field effect transistors having a gate of $0.5 \times 150$ μm and dissipates about 60 mW. A complete description of these isolator circuits can be found in the publication entitled: "A Monolithic GaAs 1-13 GHz Travelling-Wave Amplifier" by YALCIN AYASLI et al. in IEEE TRANSACTIONS ON MICROWAVE THEORY AND TECHNIQUES, Vol. MTT-30, No. 7, July 1982, pp. 976-981.

This prior art isolator circuit presents various disadvantages:

the 12-dB return losses and the 20-dB isolation realized by means of this circuit are not sufficient for the considered application mentioned above;

the use of 4 transistors to form this circuit leads to a considerable power consumption of 60 mW;

the occupied surface is large (2 mm²) which presents a disadvantage as to its use in integrated circuits;

the performance is sensitive to the technological parameters.

In contradistinction, the isolator circuit of the above-mentioned Patent is different.

In the above Patent the isolator circuit comprises a common-gate FET at the input and a common-drain FET at the output. The size of the FET's is optimized to obtain a good adaptation to 50 Ohms.

The isolator known from this Patent further includes series L-C circuits, connected between the transmission line and ground whose function is to balance the isolator. The first transistor operates as an amplifier arranged for the high frequencies. The circuit is provided to block the low frequencies in either one of the two directions.

This above-mentioned Patent points out that the second transistor presents a gate-source impedance which is so high that a reflected signal, entering the output terminal and propagating in the reverse input-output direction, has an attenuation of 25 dB.

In reality those skilled in the art know that the gate-source capacitance of a transistor is approximately 10 times smaller than its gate-drain capacitance. The performance disclosed in the above Patent therefore seems utterly overestimated.

Another publication entitled "ACTIVE ISOLATOR, COMBINER, DIVIDER, AND MAGIC-T AS MINIATURIZED FUNCTION BLOCKS" by Tsuneo Tokumitsu, in GaAs IC SYMPOSIUM IEEE 1988 pp. 273-276 describes the same isolator circuit.

In this publication it is described that the isolation is only 20 dB at 10 GHz with input return losses of 15 dB at the same frequency.

This performance is insufficient for the applications contemplated for the present invention.

On the other hand, the isolator circuits known from the Patent and from the latter of the above publications comprise 4 inductive impedances which are elements each requiring a large surface in a circuit, and which are thus to be avoided as much as possible for the applications in integrated circuits.

SUMMARY OF THE INVENTION

It is an object of the present invention to provide an active isolator circuit which obtains a better adaptation as well as a better isolation than the prior art circuits over a wide frequency band, and to achieve this by means of a very simple compact circuit which is not very sensitive to technological parameters and has a low power consumption.

These objects are achieved by means of an arrangement as described in the opening paragraph, which is further characterized in that the isolator circuit includes a negative feedback amplifier used in the reverse sense.

Under these conditions the isolator according to the invention may be much simpler than the transmission-line amplifier known from the above publication and Patent.

In one embodiment the arrangement according to the invention is characterized in that this amplifier comprises a stage including a common-source field effect transistor whose drain receives the input signal $V_E$, and whose gate produces the output signal $V_S$, and a negative feedback branch connected between the gate and the drain.

The circuit according to the invention thus presents the advantage that it can be realized with any technology by means of field effect transistors, for example, with technologies in which III-V compounds or also silicon are used.

In technologies utilizing the III-V compounds, the attained operating frequencies may be extremely high.

BRIEF DESCRIPTION OF THE DRAWING

The invention will be better understood from the following description in conjunction with the accompanying drawings in which:

FIG. 1b shows the equivalent-circuit diagram of the isolator of FIG. 1a;

DETAILED DESCRIPTION OF THE INVENTION

Figure 1A:
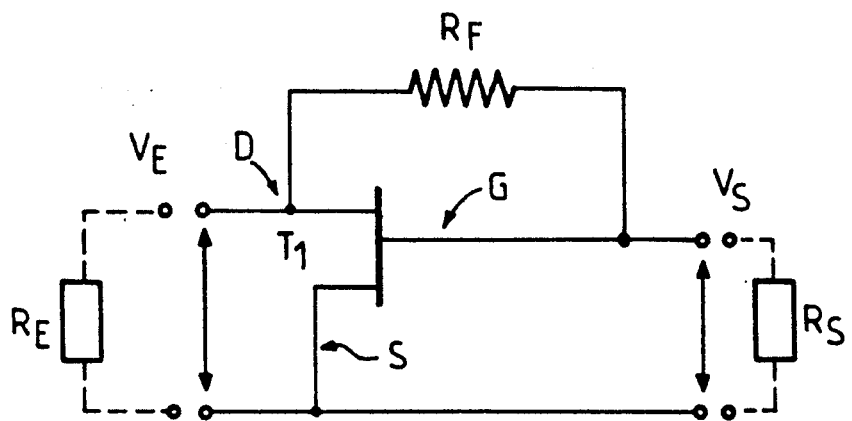
FIG. 1a shows in a diagram the isolator circuit according to the invention.

As is represented in FIG. 1a, the isolator circuit according to the invention comprises a field effect transistor $T_1$, having source S, gate G and drain D. The field effect transistor is an active semiconductor amplifying element having principal conduction electrodes, source S and drain D, between which conduction occurs, and a control electrode, gate G. In order to realize an isolator circuit, this field effect transistor is arranged as a negative feedback amplifier used in the reverse sense, i.e., the gate G defines the isolator circuit output and the drain D defines the isolator circuit input.

For this purpose a negative feedback branch including a resistor $R_F$ is inserted between the gate and the drain of this transistor $T_1$. The input signal $V_E$ is applied between its source and its drain and the output signal $V_S$ is taken off between its source and its gate. The output impedance of the preceding circuit is symbolized by the resistor $R_E$ connected between the drain and the source of transistor $T_1$. The input impedance of the following circuit is symbolized by the resistor $R_S$ connected between the gate and the source of transistor $T_1$. The negative feedback conductance is thus $g_F = 1/R_F$; the input conductance is thus $g_E = 1/R_E$; and the output conductance $g_S = 1/R_S$.

Figure 1B:
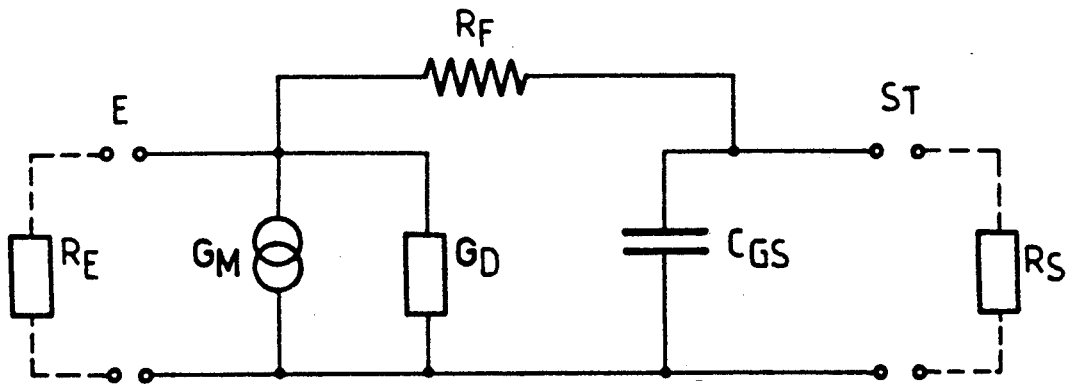

The diagram of FIG. 1b is the equivalent-circuit diagram of the isolator of FIG. 1a, where $g_m$ represents the transconductance of the transistor $T_1$, $g_D$ represents its drain conductance, $R_F$ is again the resistance of the negative feedback branch and $C_{GS}$ is the gate-source capacitance of the transistor $T_1$.

Under these conditions the gain of the isolator circuit according to the invention is given by the equation (1) of Table I. The input conductance of this isolator is $Y_E$ given by the equation (2). In these equations $\omega$ is the angular frequency of the signal $V_E$ of frequency F applied to the input of the isolator circuit.

In Table I, the isolation represented by the ratio of the input voltage to the output voltage is given by the equation (3); the output conductance of the isolator is $Y_S$ given by the equation (4).

In the equation (4) the term $j\omega C_{GS}$ is a small susceptance which increases with frequency and may impose limitations at very high frequencies.

According to the invention it is necessary for the negative feedback conductance $g_F$ to be equal to the transconductance $g_m$ of the transistor $T_1$. Under these conditions the term giving the isolation becomes zero which means that the gain of the reverse-sense circuit is zero.

On the other hand, the isolator circuit according to the invention is desired to consist in an adaptation of the preceding and following circuits to a given reference impedance $R_0$. In order to achieve this result the characteristic features of the field effect transistor $T_1$ are chosen such that the sum of its transconductance $g_m$ and its drain conductance $g_D$ is equal to the inverse of the given impedance $R_0$.

These conditions are recalled by the equations (5) and (6) of Table III.

The result of this is that the input impedance of the isolator circuit according to the invention is thus expressed by the equation (7) and its output impedance by the equation (8) of table III.

If the reference impedance $R_0$ is chosen to be equal to 50 Ω, the isolator gain $V_S/V_E$ will be equivalent to ½ (equation 1bis of Table III), and the isolation $V_E/V_S$ equal to 0 (equation 3bis of Table III).

In an embodiment of the invention, the negative feedback branch may comprise no more than one resistor $R_F$ arranged between the gate and the drain of the transistor $T_1$. If the reference impedance $R_0$ is chosen to be equal to 50 Ω, the magnitude of the transistor is thus to be chosen such that $g_m + g_D = 20$ mS.

Under these conditions the input conductance $Y_E = 20$ mS and the output conductance $Y_S$ is equal to 20 mS, plus a small susceptance as mentioned hereinbefore.

Figure 2:
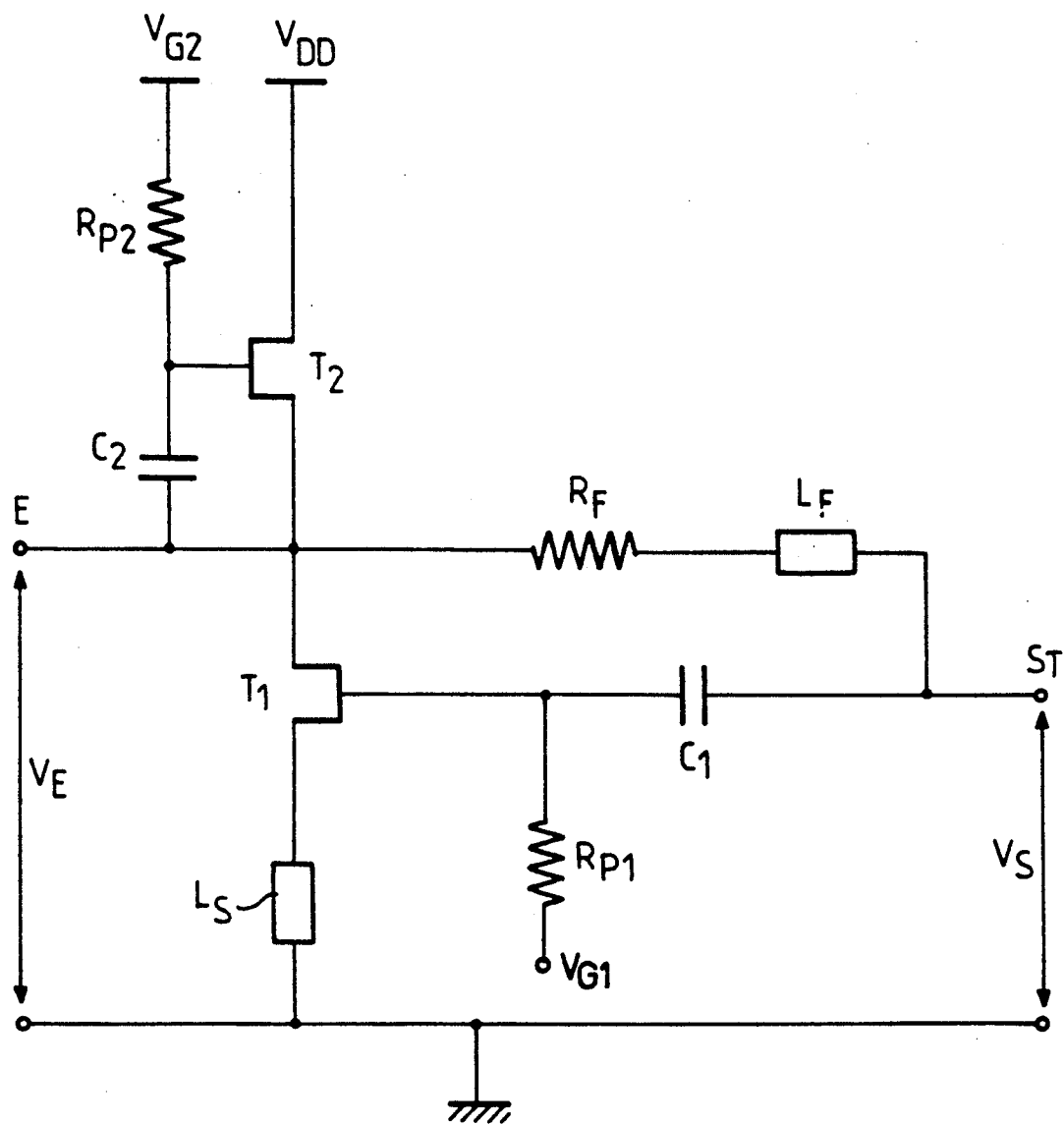
FIG. 2 shows in a diagram the isolator circuit in an implementation with gallium arsenide field effect transistors.

As is represented in FIG. 2, the isolator circuit according to the invention is a particularly appropriate implementation to be utilized at high frequencies. At these high frequencies delays appear due to the transit time of the electrons under the gate of transistor $T_1$ and to the time constants produced by the access and intrinsic resistances of the transistor and also due to the gate-source capacitance. In order to compensate for these delays at high frequencies, the negative feedback branch may also comprise a transmission line $L_F$ connected in series to the resistor $R_F$. This transmission line will preferably be a microstrip line. In the embodiment of the circuit according to the invention shown in FIG. 2 the gate of transistor $T_1$ comprises bias means to render the value of the transconductance $g_m$ of the transistor $T_1$ adjustable and to compensate for the effects of the dispersions of its characteristic features due to the used fabrication technique. These bias means have a negative d.c. bias voltage $V_{G1}$ applied to the gate through a resistor $R_{P1}$.

On the other hand, when the circuit according to the invention illustrated in FIG. 2 is used, it has been established that the circuit performance could be advantageously improved by providing the transistor $T_1$ with an active load. For this purpose, a transistor $T_2$ is inserted between a d.c. supply voltage $V_{DD}$ and the drain of transistor $T_1$. In addition, the gate of transistor $T_2$ is biased through a resistor $R_{P2}$ by a positive bias voltage $V_{G2}$. Optionally, a capacitor $C_2$ connects the gate of load transistor $T_2$ to the drain of the transistor $T_1$ of the isolator circuit. Finally, a decoupling capacitor $C_1$ may be inserted between the junction of the gate and the resistor $R_{P1}$, and the point ST where the negative feedback branch is connected, that is to say, the point where the output voltage $V_S$ is taken off.

In an exemplary embodiment the circuit shown in FIG. 2 is realized by means of the elements of Table II. The reference impedance for the isolator is $R_0 = 50\ \Omega$, the transistor $T_1$ of the isolator and $T_2$ of the load are MESFET's realized by means of gallium arsenide (GaAs). The thickness of the GaAs substrate underneath the isolator circuit is 100 μm. The source of transistor $T_1$ is connected to ground by means of a metallized opening which realizes a connecting inductive impedance $L_S$ which is equivalent to an inductance of approximately 0.03 nH. The other elements are shown in Table II. For the calculation of the line length one has taken into account equation (9) shown in Table I in which the elements to resolve this equation are also shown.

Figure 3A:
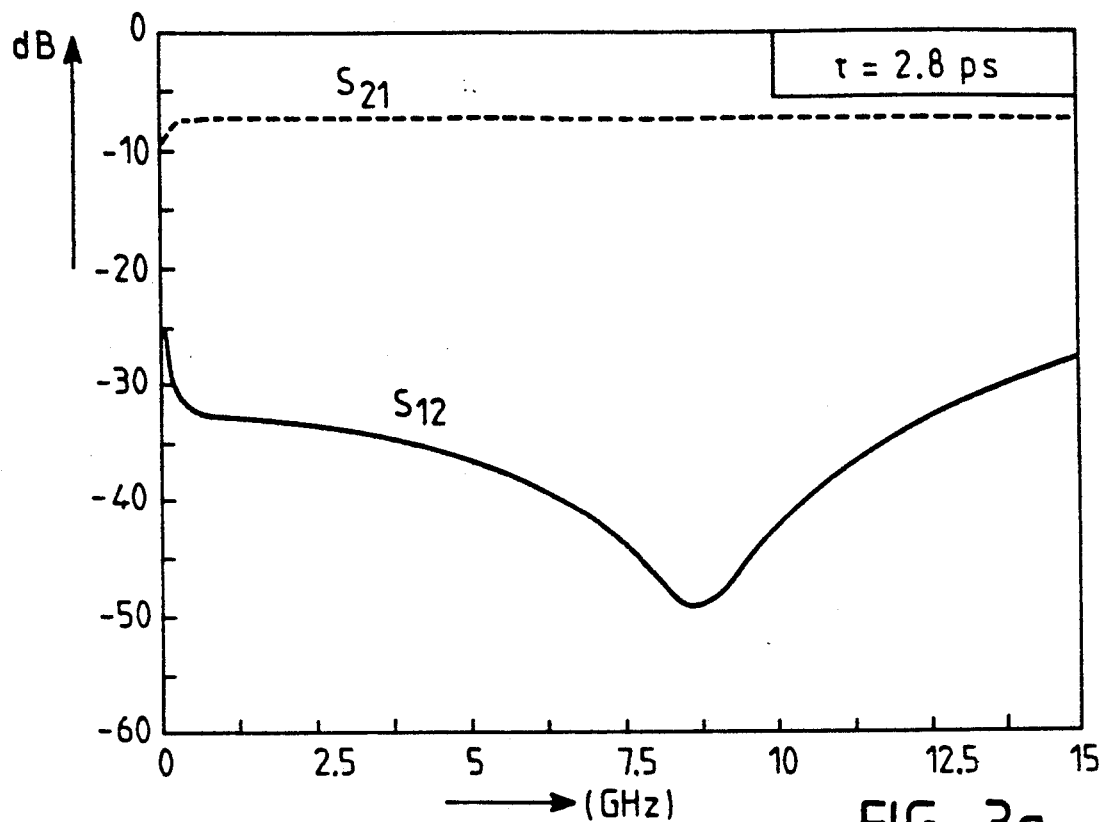
FIGS. 3a and 3b show, plotted against frequency, the parameters S21, S12, S22 and S11 in dB of the isolator circuit according to the invention for an electron transit time under the gate of 2.8 ps.
Figure 3B:
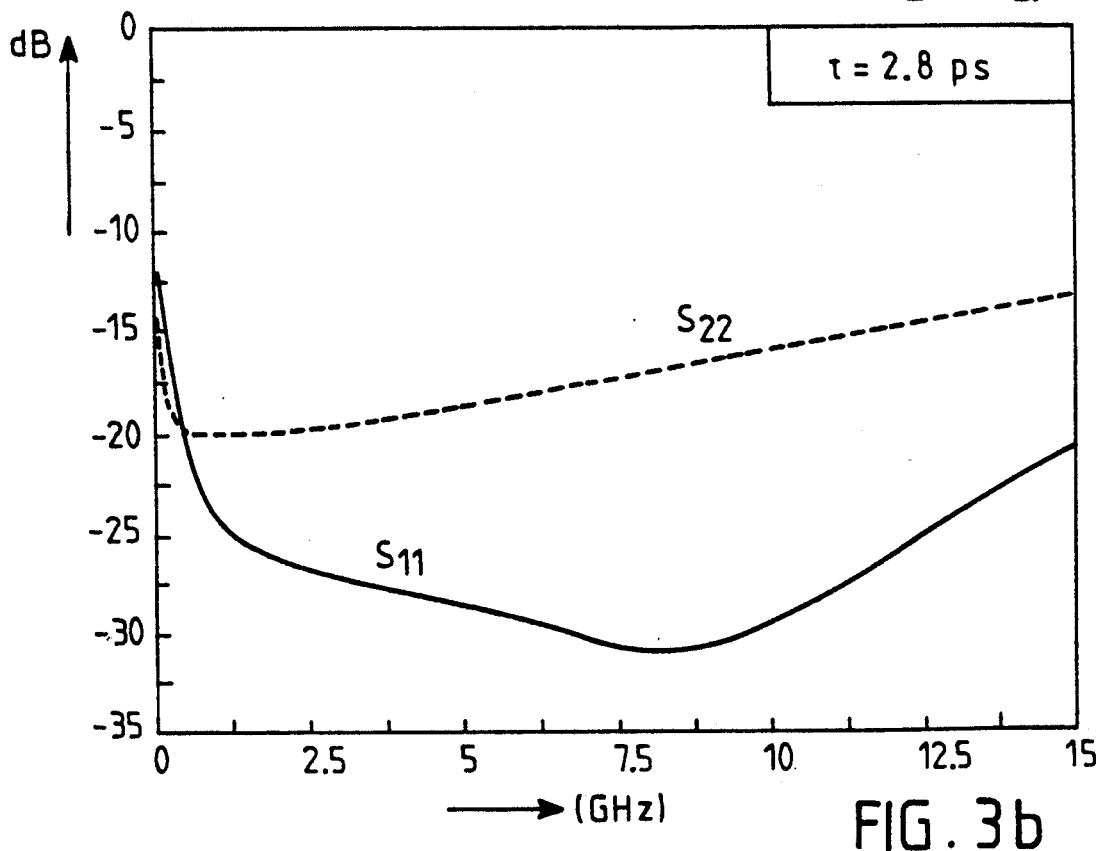

The performance of the circuit is illustrated by the FIGS. 3 to 5. The FIGS. 3a and 3b show the parameters S21, S12, S22 and S11 in dB of the circuit plotted against frequency in GHz for a transit time τ of 2.8 ps. From the curves it may be deduced that the isolation is better than 30 dB and the input return losses are better than 20 dB in a 1-13 GHz frequency band. Thus, the obtained performance is distinctly better than that of the circuit described as the state of the art.

In addition, the circuit according to the invention is more compact because it is realized by means of a single reactive element. The power consumption is lower because only one transistor is used which presents a thickness of 100 μm in the above exemplary embodiment. Moreover, the performance of the circuit is not sensitive to the transconductance $g_m$ of the transistor, and the latter may be adjusted by influencing the gate bias $V_{G1}$ of the transistor $T_1$. This allows of compensating for the effects of the dispersion of the characteristic features of the transistor $T_1$ due to the used implemented.

Figure 4A:
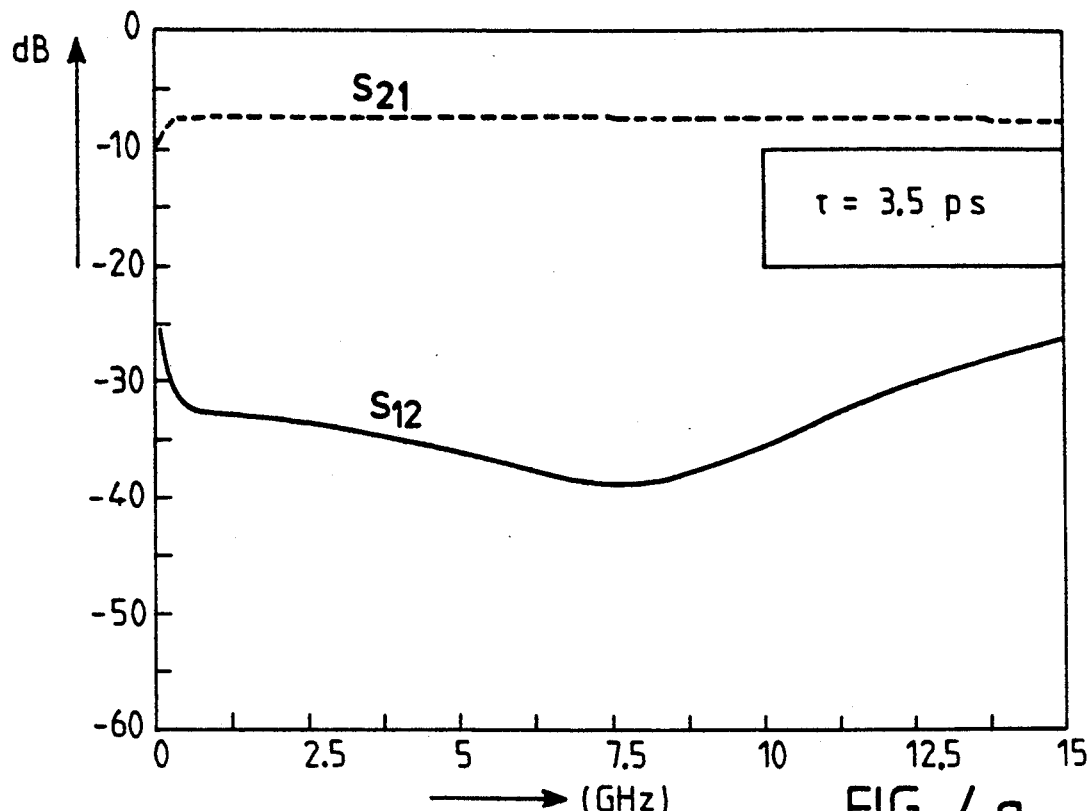
FIGS. 4a and 4b show these same parameters for a transit time of 3.5 ps.
Figure 4B:
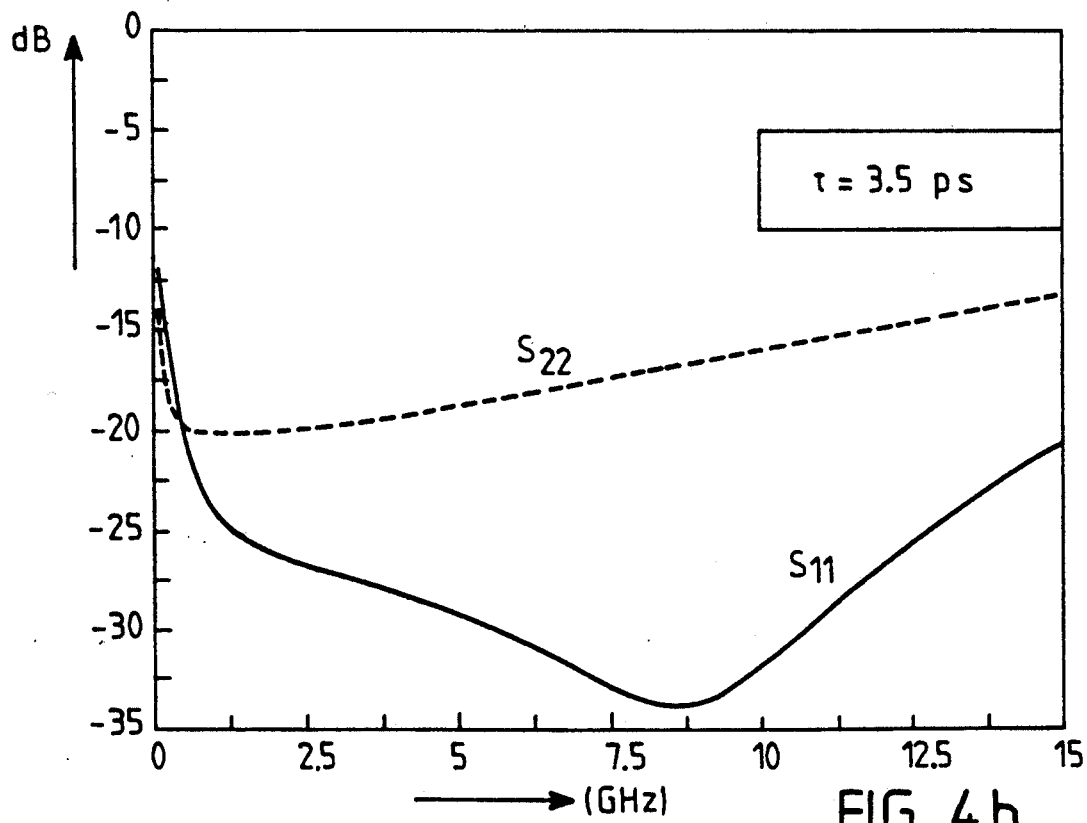
Figure 5A:
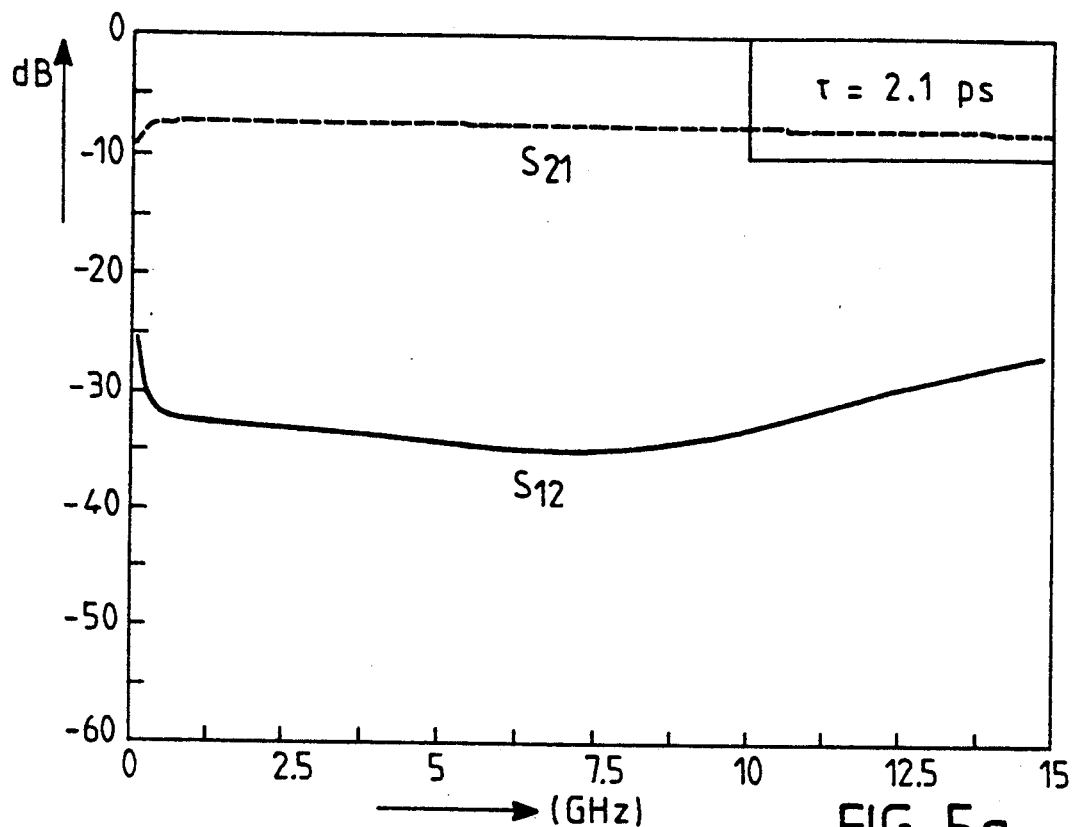
FIGS. 5a and 5b show these same parameters for a transit time of 2.1 ps.
Figure 5B:
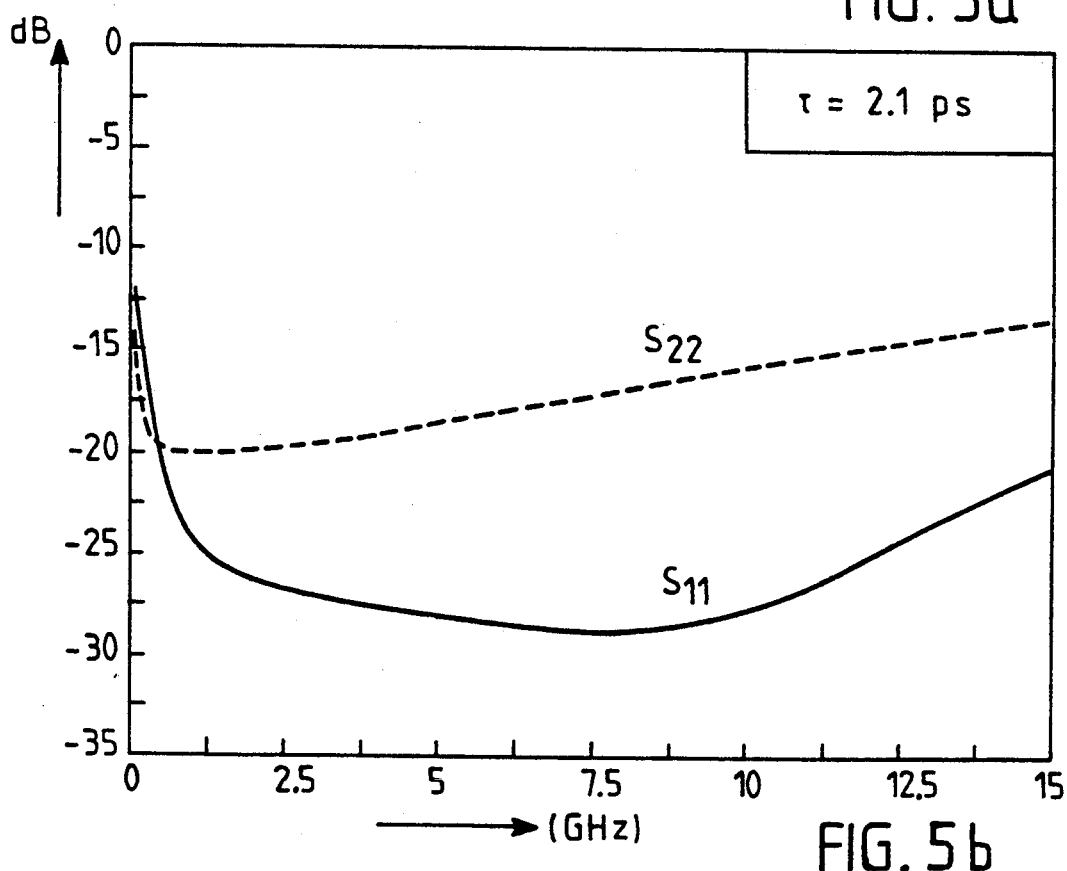

The FIGS. 4a and 4b show these same parameters for a transit time τ of 3.5 ps and the FIGS. 5a and 5b show these parameters for a transit time τ of 2.1 ps.

The FIGS. 4 and 5 thus show the performance of the isolator under the conditions in which the transit time of the electrons is 25% longer or 25% shorter with respect to the initial value of the FIG. 3. It has been found that the response of the circuit has changed but that the performance has not degraded; that is to say, that the isolation is always better than 30 dB and that the input return losses are always better than 20 dB in the 1-13 GHz frequency band.

It should be observed that the active load has been chosen to diminish the losses of the circuit and that one has unexpectedly established that this arrangement improved the isolation.

The circuit according to the invention is absolutely monolithically integrable, very compact and has a very large frequency bandwidth. It eliminates the problems of reflection which appear in the microwave circuits, for example, when series-connected blocks present a mismatch, or also if the circuit contains an oscillator, to avoid this oscillator exhibiting frequency shift.

The circuit according to the invention does not present an extremely high direct gain, but this is a slight disadvantage which is no problem because, when an integrated microwave circuit is concerned, it is easy to add a small amplifier so as to recover this type of losses.

The circuit according to the invention can also be advantageously realized by means of transistors known to those skilled in the art by the name of HEMT and, more generally, by means of any field effect transistor such as the transistors known to those skilled in the art by the name of MOSFET.

TABLE I $g_m$ = transconductance of the transistor $T_1$
$g_F = 1/R_F$ conductance of the negative feedback resistor
$g_E = 1/R_E$ output conductance of the preceding circuit
$g_S = 1/R_S$ input conductance of the following circuit
$g_D$ = drain conductance of the transistor $T_1$
$C_{GS}$ = gate-source capacitance of transistor $T_1$
ω = angular frequency of the input and output signals, $V_E$ and $V_s$, having a frequency F.
Isolator gain = $V_S/V_E = g_F/(g_F + g_S + j\omega C_{GS})$ (1)
Input conductance of the isolator = $Y_E$
$Y_E = g_F + g_D + g_F(g_m - g_F)/(g_F + g_S + j\omega C_{GS})$ (2)
Isolation: $V_E/V_S = -(g_m - g_F)/(g_F + g_E + g_D)$ (3)
Output conductance of the isolator = $Y_S$
$Y_S = j\omega C_{GS} + g_F(g_m + g_D + g_E)/(g_F + g_D + g_E)$ (4)
Line length l
$l = (R_F/Z_c)v\tau$ (9)
where v is the phase velocity of propagation
and $\tau = \tau_1 + \tau_2$
with $\tau_1$ = transit time of the electrons under the gate
$\tau_2 = (R_G + R_{GS})\,C_{GS}$
$R_G$ = gate resistance
$R_{GS}$ = gate-source resistance
and $Z_c$ = characteristic impedance of the line.

TABLE II

Reference impedance for the isolator $R_O = 50\ \Omega$
Transitors $T_1$, $T_2$ = MESFET's realized by means of gallium arsenide (GaAs), having two gate fingers
Gate length of the transistors $T_1$, $T_2$ $l_G \approx 0.5$ μm
Gate width of the transistors $T_1$, $T_2$ $W_G \approx 100$ μm
Thickness of the substrate in GaAs under the isolator circuit H = 100 μm
Inductive impedance for connecting the source of the transitor $T_1$ to ground $L_S \approx 0.03$ nH
Load resistors $R_{P1} = R_{P2} = 10$ kΩ
D.C. isolation capacitor $C_1 = 1$ pF
Resistor $R_F$ of the negative feedback branch: $R_F = 59.4\ \Omega$
Microstrip line $L_F$ of the negative feedback branch
having width W1 = 10 μm
having length L1 = 458 μm
Characteristic impedance of the line Z1 = 0.46 nH (≈0.5 nH)
Negative bias voltage $V_{G1} = -0.5$ V
Positive bias voltage $V_{G2} = 2.5$ V
D.C. supply voltage $V_{DD} = 4$ V

TABLE III $g_m = 1/R_F = g_F$ (5) $1/R_o = g_m + g_D$ (6)
Input impedance $Z_E = 1/(1/R_F + g_D) \approx R_F = R_O$ (7)
Output impedance $Z_S = 1/(1/R_F + j\omega C_{GS}) \approx R_F = R_O$ (8)
Isolator gain = $V_S/V_E = \frac{1}{2}$ (1bis)
Isolation = $V_E/V_S = 0$ (3bis)

We claim:

1. An integrated semiconductor isolator circuit comprising:

a negative feedback amplifier comprised of an active semiconductor amplifying element having a pair of principal conduction electrodes and a control electrode, one of said conduction electrodes comprising an input of said isolator circuit and said control electrode being coupled to an output of said isolator circuit, and a negative feedback circuit connected between said control electrode and said one of said conduction electrodes comprising said input of said isolator circuit.

2. An isolator circuit as claimed in claim 1, characterized in that said active semiconductor element comprises a common-source field effect transistor whose drain receives the input signal and whose gate produces the output signal, and said negative feedback circuit is connected between the gate and the drain.

3. An isolator circuit as claimed in claim 2, comprising means for presenting a reverse-sense zero gain and an impedance equal to a given reference impedance $R_0$.

4. An isolator circuit as claimed in claim 3, characterized in that the conductance $g_R$ of the negative feedback circuit and the transconductance $g_m$ of the field effect transistor are selected to be equal, so that said feedback amplifier presents a reverse-sense zero gain.

5. An isolator circuit as claimed in claim 4, characterized in that the characteristic features of the field effect transistor are chosen such that the sum of its transconductance $g_m$ and its drain conductance $g_D$ is equal to the inverse value of the given impedance $R_0$, so that said feedback amplifier presents an impedance equal to a given impedance $R_0$.

6. An isolator circuit as claimed in claim 5, characterized in that the negative feedback circuit is a branch comprising a resistor $R_F$.

7. An isolator circuit as claimed in claim 6, wherein, for compensating at high frequencies for the delays caused by the transit times of the electrons under the gate and caused by the time constants produced by the access and intrinsic resistances of the transistor and gate-source capacitance, the negative feedback branch further comprises a line $L_F$ connected in series with the resistor $R_F$.

8. An isolator circuit as claimed in claim 4 wherein in order to render the value of the transconductance $g_m$ of the transistor adjustable, and to compensate for the effects of the dispersions of its characteristic features due to technology, the gate of the transistor is provided with gate bias means for biasing the gate.

9. An isolator circuit as claimed in claim 8, characterized in that the gate bias means have a negative d.c. bias voltage $V_{G1}$ applied to the gate through a resistor $R_{P1}$.

10. An isolator circuit as claimed in claim 2, further comprising an active load connected to the drain of the field effect transistor.

11. An isolator circuit as claimed in claim 10, wherein the active load comprises a second field effect transistor whose source is connected to the drain of the first mentioned field effect transistor, whose drain is connected for receiving a d.c. supply voltage $V_{DD}$ and whose gate is connected for receiving a positive d.c. bias voltage $V_{G2}$ through a resistor $R_{P2}$.

12. An isolator circuit as claimed in claim 11, characterized in that it is fabricated with a technology using compound III-V field effect transistors.

13. An isolator circuit as claimed in claim 12, characterized in that the first and second transistors are gallium arsenide MESFETs having two gate fingers, the gate length $l_G$ being equivalent to 0.5 $\mu$m, the gate width $W_G$ being equivalent to 100 $\mu$m.

14. An isolator circuit as claimed in claim 13, characterized in that the negative feedback branch comprises a resistor $R_F$ whose resistance is about 60 $\Omega$, in that a line connected in series with this resistor is a microstrip line having a characteristic impedance of approximately 100 $\Omega$ corresponding to an inductive impedance of approximately 0.5 nH.

15. An isolator circuit as claimed in claim 14, further comprising means for applying the negative bias voltage $V_{G1} = -0.5$ V, the positive bias voltage $V_{G2} = +2.5$ V, and the d.c. supply voltage $V_{DD} = 4$ V, and wherein a bias resistor $R_{P1}$ is provided for applying voltage $V_{G1}$ and a bias resistor $R_{P2}$ is provided for applying voltage $V_{G2}$, each of said bias resistors being equal to 10 k$\Omega$.

16. An isolator circuit as claimed in claim 15, characterized in that a decoupling capacitor $C_1$ is inserted between the end of a the bias resistor $R_{P1}$ and the output ST at a junction of the negative feedback branch.

17. An isolator circuit as claimed in claim 11, characterized in that it is realized with a technology using MOSFET silicon field effect transistors.

18. An isolator circuit as claimed in claim 11, further comprising a capacitor connected between the gate and the source of said second field effect transistor.

* * * * *